United States Patent
Nielsen et al.

(10) Patent No.: US 8,565,933 B2
(45) Date of Patent: Oct. 22, 2013

(54) HEATSINK WITH A PLURALITY OF FANS

(75) Inventors: Erik R. Nielsen, Houston, TX (US); Richard A. Bargerhuff, Houston, TX (US); Carl Massey, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 200 days.

(21) Appl. No.: 13/056,105

(22) PCT Filed: Jul. 31, 2008

(86) PCT No.: PCT/US2008/071847
§ 371 (c)(1), (2), (4) Date: Jan. 26, 2011

(87) PCT Pub. No.: WO2010/014106
PCT Pub. Date: Feb. 4, 2010

(65) Prior Publication Data
US 2011/0130891 A1 Jun. 2, 2011

(51) Int. Cl.
*G05D 23/00* (2006.01)

(52) U.S. Cl.
USPC .................. 700/300; 700/9; 700/275

(58) Field of Classification Search
USPC .............................. 700/300, 9, 275
See application file for complete search history.

(56) References Cited

U.S. PATENT DOCUMENTS

| | | | |
|---|---|---|---|
| 5,638,895 A * | 6/1997 | Dodson | 165/121 |
| 7,128,135 B2 | 10/2006 | Mok et al. | |
| 7,310,226 B2 | 12/2007 | Chen et al. | |
| 7,359,195 B2 | 4/2008 | Lee | |
| 2005/0006085 A1 | 1/2005 | Nelson | |
| 2005/0167083 A1 | 8/2005 | Belady et al. | |
| 2005/0259395 A1 | 11/2005 | Espinoza-Ibarra et al. | |
| 2006/0037334 A1* | 2/2006 | Tien et al. | 62/178 |
| 2006/0102324 A1* | 5/2006 | Mok et al. | 165/104.33 |
| 2006/0181846 A1 | 8/2006 | Farnsworth et al. | |

FOREIGN PATENT DOCUMENTS

| | | |
|---|---|---|
| CN | 1411332 | 4/2003 |
| CN | 1836197 | 9/2006 |
| JP | 01-222652 | 9/1989 |
| JP | 09-083166 | 3/1997 |

OTHER PUBLICATIONS

International Search Report and Written Opinion, dated Feb. 27, 2009, 12 pages.

* cited by examiner

*Primary Examiner* — Carlos Ortiz Rodriguez

(57) ABSTRACT

A heatsink includes a plurality of fans mounted to the heatsink. The plurality of fans includes a first fan that provides an airflow for the heatsink and a second fan that selectively modifies the airflow.

12 Claims, 5 Drawing Sheets

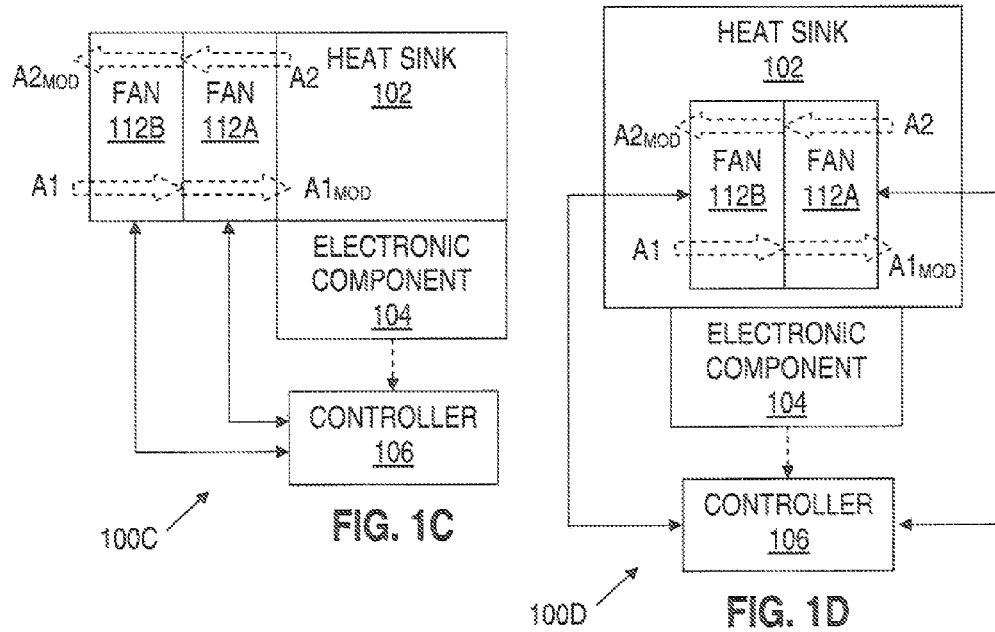
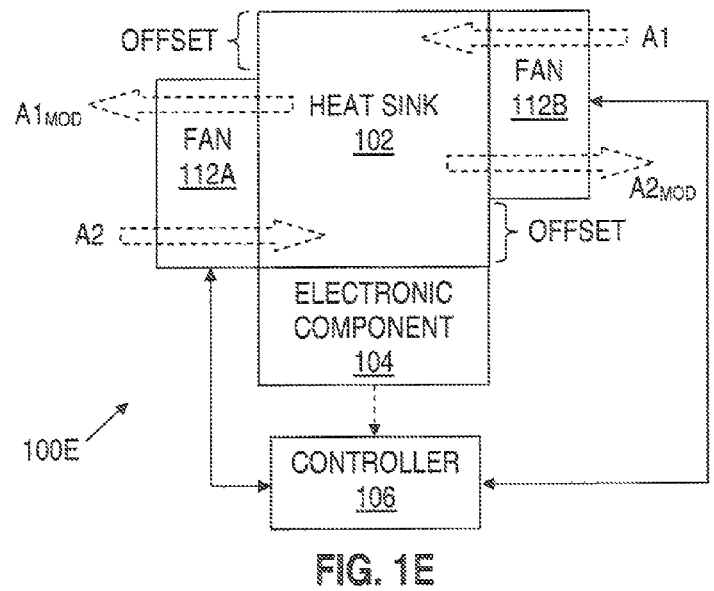

HEATSINK WITH A PLURALITY OF FANS

BACKGROUND

Electrical devices include numerous components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, an electrical device is designed to operate correctly within a predetermined temperature range. If the temperature exceeds the predetermined maximum the device may not function correctly, thereby potentially degrading the overall performance of the electrical device. Thus, many electrical devices include cooling systems to regulate the temperature of their electrical components. Some cooling systems involve a heatsink, which thermally contacts (direct or radiant) an electronic component and dissipates heat from the electronic component. The ability of a heatsink to dissipate heat is affected by various factors such as material, geometry, and surface area of the heatsink. Also, heat sinks can be combined with a fan or other fluid pump to improve heat dissipation. Adding a fan (or other fluid pump) to a heatsink may raise various issues such as how to fit the fan in a limited space, how to control the timing and speed of fan operation, and the possibility of failure. In general, as electronic devices proliferate, the need for efficient and reliable heat dissipation increases.

BRIEF DESCRIPTION OF THE DRAWINGS

For a detailed description of exemplary embodiments of the invention, reference will now be made to the accompanying drawings in which:

FIGS. 1A-1E show various systems in accordance with embodiments of the disclosure;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1A:
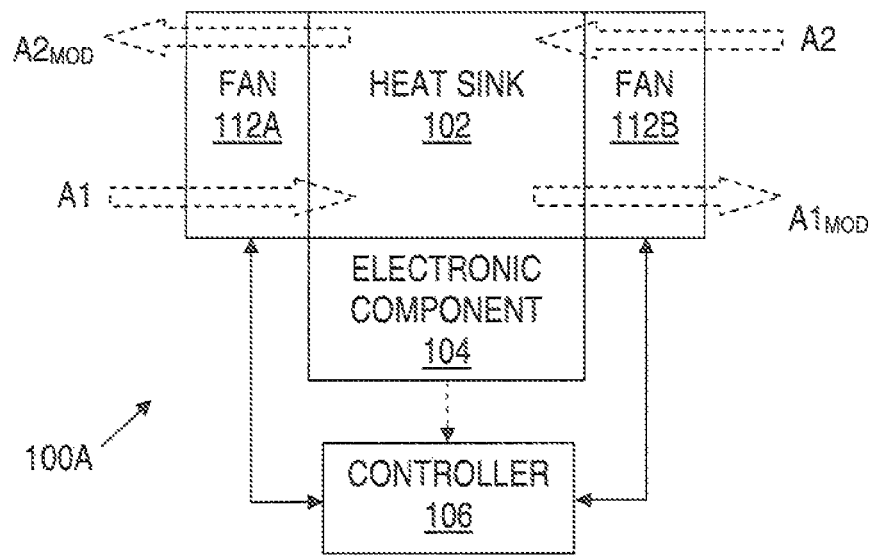

FIGS. 1A-1E show various systems 100A-100E in accordance with embodiments of the disclosure. In FIG. 1A, the system 100A comprises an electronic component 104 having a heatsink 102 thermally coupled thereto. The thermal coupling may be direct (e.g., via physical contact and/or thermal fillers, but no airspace between the electronic component 104 and the heatsink 102) or radiant (e.g., with airspace between the electronic component 104 and the heatsink 102). In either case, the heatsink 102 dissipates heat from the electronic component 104. In at least some embodiments, the heatsink 102 comprises a metallic (e.g., copper) block with fins to increase the surface area of the heatsink 102. In different embodiments, the material, geometry, and surface area of the heatsink 102 may vary. For example, the heatsink 102 may be sized to provide a predetermined amount of heat dissipation and/or to fit in a predetermined space of an electronic device that houses the electronic component 104.

As shown in FIG. 1A, a plurality of fans 112A and 112B are provided for the heatsink 102 to assist with heat dissipation. As an example, the fans 112A and 112B may be mounted to the heatsink 102 using suitable connections points and fasteners. In such embodiments, the heatsink 102 and fans 112A, 112B form a modular cooling system that can easily be implemented in different systems without requiring additional fasteners for the fans 112A and 112B. In the system 100A, the fans 112A and 112B are arranged on opposite or non-adjacent sides of the heatsink 102. To control the fans 112A and 112B, a controller 106 in communication with the fans 112A and 112B is provided. In accordance with at least some embodiments, the controller 106 selectively operates the fans 112A and 112B in one of a plurality of modes. In a first mode, the controller 106 directs the fans 112A and 112B to operate simultaneously. In a second mode, the controller 106 directs the fans 112A and 112B to operate in a mutually exclusive manner (one at a time). In at least some embodiments, the first mode corresponds to a default mode.

For either mode, the controller 106 is able to detect when one of the fans 112A and 112B fails. For example, if a given fan draws excessively high or low amounts of current, the controller 106 may determine that the given fan is in a failed state. In response to detecting a failed fan, the controller 106 directs the non-failed fan to compensate for the failed fan.

In the system 100A, the fans 112A and 112B are able to provide different airflows to assist with heat dissipation. In general, the different airflows can be categorized by intensity and direction. An example of varying the airflow intensity will be described in further detail for FIGS. 2 and 3. As an example of varying the airflow direction, the fans 112A and 112B can be controlled in a push/pull configuration, a push/push configuration, or a pull/pull configuration. In the push/pull configuration, the controller 106 directs the fan 112A to generate airflow (A1) for the heatsink 102 and directs the fan 112B to modify that airflow ($A1_{MOD}$). As an example, if A1 is parameterized as having a given direction and speed, the fan 112B modifies the direction and/or speed of A1 to generate $A1_{MOD}$. Alternatively, the controller 106 directs the fan 112B to generate airflow (A2) for the heatsink 102 and directs the fan 112A to modify that airflow ($A2_{MOD}$). In other words, the controller 106 may direct the fan 112A to push air towards the heatsink 102 and direct the fan 112B to pull air away from the heat sink 102 or vice versa. In the push/pull configuration, the heatsink 102 may at least partially channel airflow from one fan to the other.

In the push/push configuration, the controller 106 directs both fans 112A and 112B to push air towards the heatsink 102. In the pull/pull configuration, the controller 106 directs both fans 112A and 112B to pull air away from the heatsink 102. In at least some embodiments, the controller 106 is able to determine which configuration is most efficient (i.e., which configuration best maintains or lowers the temperature of the electronic component 104).

In at least some embodiments, the controller 106 directs the fans 112A and 112B in accordance with one or more control parameters. The control parameters may correspond to the temperature of the electronic component 104, the electrical current drawn by the electronic component 104, the electrical current drawn by the fans 112A and 112B, a fan failure detection or other parameters. In some embodiments, the controller 106 monitors the temperature of the electronic component 104 (e.g., in some embodiments, the electronic component 104 may have a built-in temperature sensor) and directs the fans 112A and 112B so that the temperature is less than a predetermined threshold. In some embodiments, the controller 106 monitors the current drawn by the electronic component 104 and directs the fans 112A and 112B accordingly. Thus, if the current being drawn by the electronic component 104 increases, the speed (rotations per minute or "RPM") of the fans 112A and 112B increases. Similarly, if the current being drawn by the electronic component 104 decreases, the speed of the fans 112A and 112B decreases. Also, in some embodiments, the controller 106 monitors the current drawn by the fans 112A and 112B and directs the fans 112A and 112B so that the current being drawn is less than a predetermined threshold.

In at least some embodiments, the controller 106 interprets various parameters together to improve efficiency of the fans 112A and 112B. For example, by monitoring the temperature of the electronic component 104 together with the current drawn by the fans 112A and 112B, the controller 106 can determine which fan speeds (determined by the current drawn) and fan direction (pushing or pulling air) best maintains or lowers the temperature of the electronic component 104. It should be understood that the particular temperature threshold, current threshold and fan speeds are application specific and thus vary from system to system.

Figure 1B:
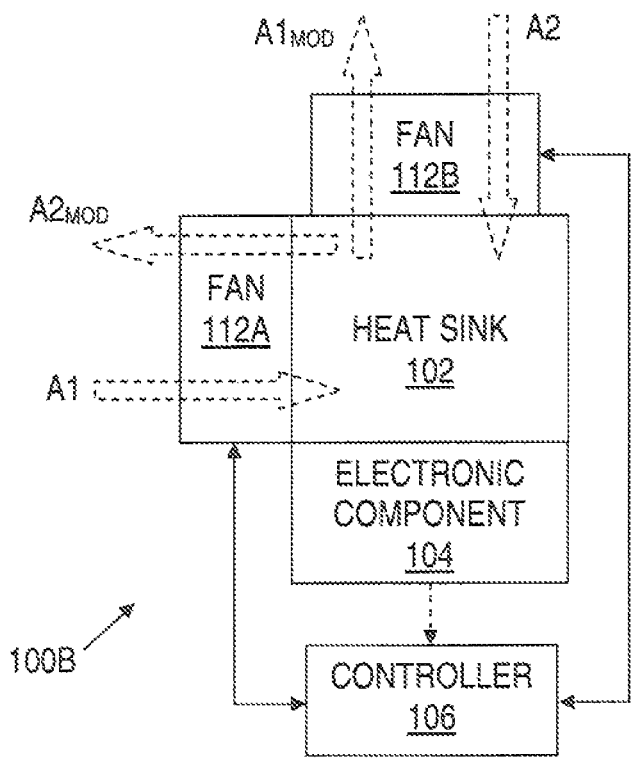

In FIG. 1B, the system 100B shows an embodiment where the fans 112A and 112B are arranged on adjacent sides of the heatsink 102. In FIG. 1C, the system 100C shows an embodiment where the fans 112A and 112B are stacked on one side of the heatsink 102. In FIG. 1O, the system 100D shows an embodiment where the fans 112A and 112B are stacked between at least two sides of the heatsink 102 (e.g., the fans 112A and 112B may be surrounded by heatsink fins on at least two sides). In FIG. 1E, the system 100E shows an embodiment where the fans 112A and 112B are offset from each other on opposite or non-adjacent sides of the heatsink 102. The offset ensures that, even if one of the fans fails or is not turned "on" (i.e., even if a fan blocks rather than improves airflow), the other fan has available a suitable airflow passage (via the offset) for heat dissipation. In alternative embodiments, similar offsets could be provided for fans arranged on adjacent sides of the heatsink 102.

As in the system 100A, each of the systems 100B-100E employs a controller 106. Thus, the discussion for system 100A regarding the controller 106 also applies to systems 100B-100E. However, it should be understood that the controller 106 may control the fans in each system 100A-100E differently due to differences in the efficiency of the various heatsink and fan arrangements. For example, if the efficiency of system 100A is higher than the efficiency of system 100B, the fans of system 100A could be operated at a lower speed than the fans of system 100B. To some degree, the efficiency of the different systems 100A-100E is affected by space and airflow interference issues in corresponding devices that house the systems 100A-100E. Because the size and efficiency of different heatsink and fan arrangements vary, a user may select one arrangement over another.

Figure 2:
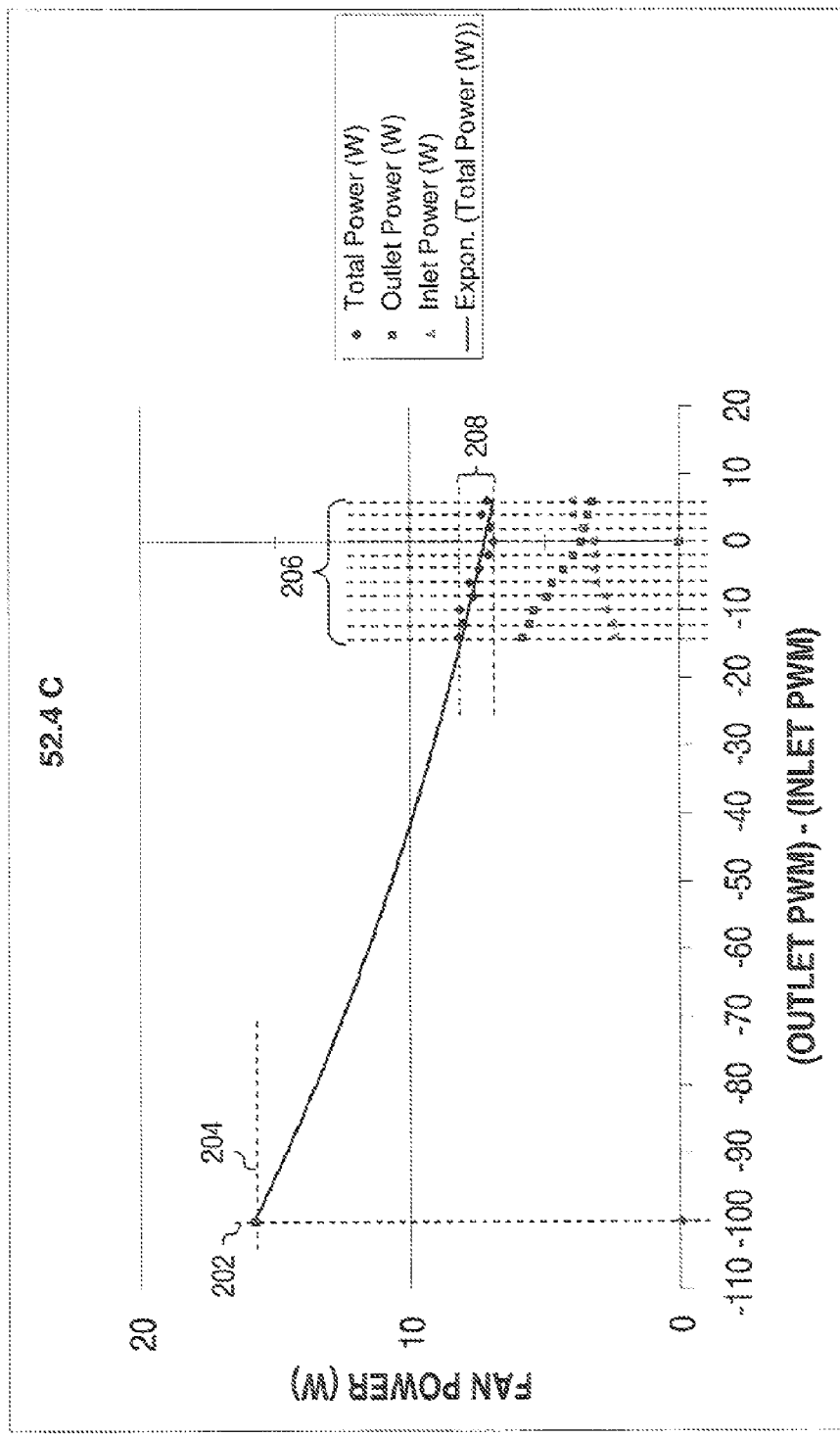
FIGS. 2 and 3 are charts that show power consumption in relation to fan operation in accordance with embodiments of the disclosure.

FIG. 2 is a chart 200 that shows power consumption in relation to fan operation in accordance with embodiments of the disclosure. In FIG. 2, the chart 200 illustrates that operating two fans (e.g., an "inlet fan" and an "outlet fan") to maintain an electronic component temperature of 52.4° C. can be more efficient than operating one fan. As used herein an "inlet fan" corresponds to a push fan and an "outlet fan" corresponds to a pull fan. In other words, FIG. 2 describes the effect of varying the airflow intensity of two fans in a push/pull configuration. In the chart 200, the fan speeds are controlled using pulse width modulation (PWM). More specifically, if the inlet fan operates at full speed and the outlet fan is off (i.e., the outlet PWM−the inlet PWM=−100 as indicated by line 202), the inlet fan consumes approximately 16 Watts (as indicated by line 204). In contrast, if the inlet fan and the outlet fan operate together, these fans can maintain the electronic component temperature of 52.4° C. and together consume less than 10 Watts. As an example, if the fans operate in the range 206 (where the outlet PWM−the inlet PWM is between approximately −15 and +7), power consumption corresponds to the range 208 (approximately 7 to 8 Watts). Thus, the efficiency of operating both fans together to maintain a temperature of 52.4° C. can vary depending on the different speeds (RPMs) of the fans.

Figure 3:
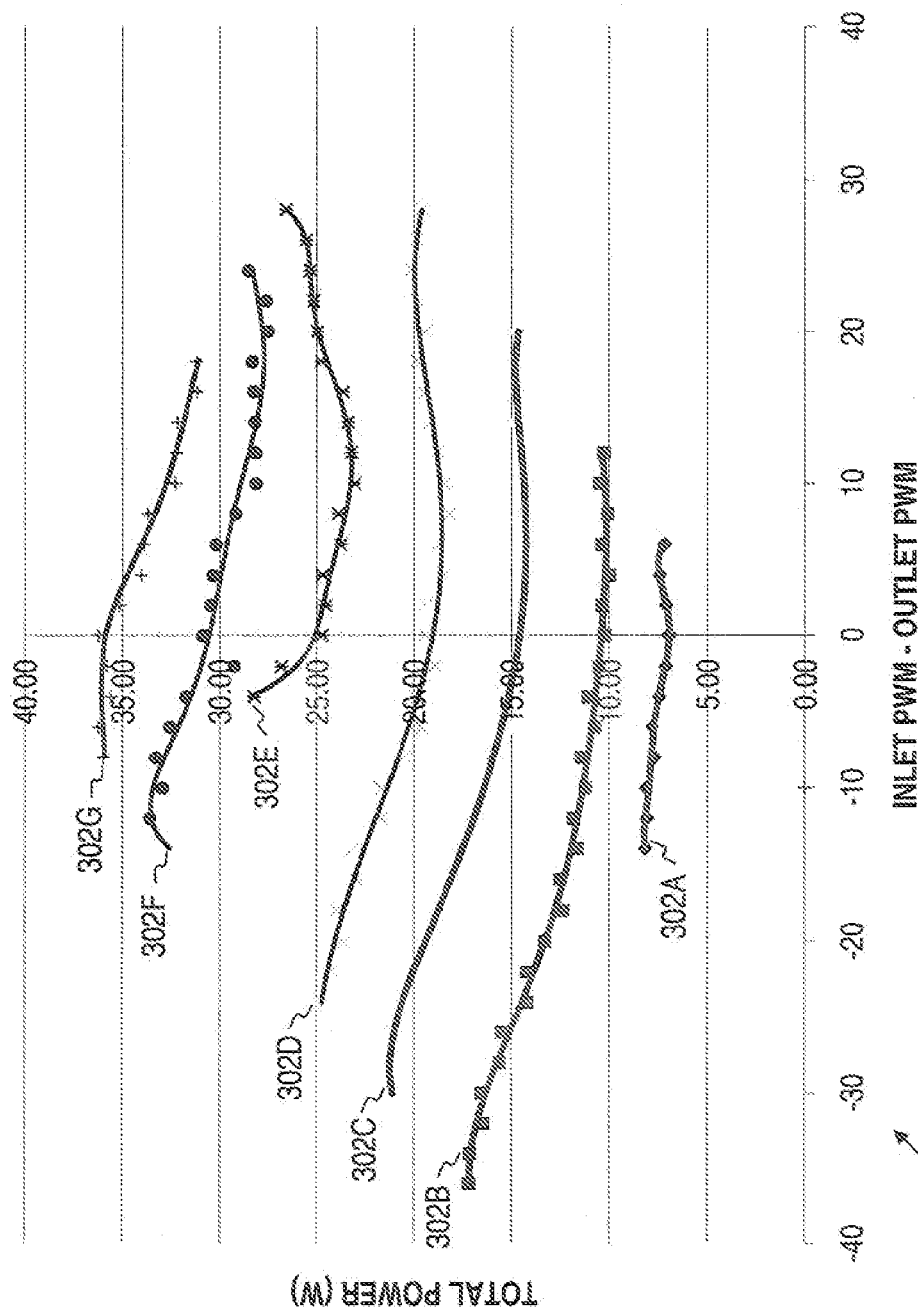

FIG. 3 is another chart 300 that shows power consumption in relation to fan operation in accordance with embodiments of the disclosure. In FIG. 3, the chart 300 illustrates that the efficiency of different speed configurations (i.e., varying the airflow intensity) for an inlet fan and an outlet fan varies according to the electronic component temperature being maintained. In the chart 300, various lines 302A-302G corresponding to different electronic component temperatures are shown. For example, the line 302A corresponds to a temperature of 41.4° C., the line 302B corresponds to a temperature of 31.5° C., the line 302C corresponds to a temperature of 26.5° C., the line 302D corresponds to a temperature of 24.6° C., the line 302E corresponds to a temperature of 23.2° C., the line 302F corresponds to a temperature of 22.0° C., and the line 302F corresponds to a temperature of 21.7° C. In general, lower electronic component temperatures are achieved by increasing the speed of both the inlet fan and the outlet fan.

In addition, the chart 300 illustrates that certain speed configurations (inlet PWM versus outlet PWM) minimize power consumption while maintaining a given temperature. For the line 302A, the speed configuration that minimizes power consumption is when the inlet fan and the outlet fan operate at approximately the same speed (i.e., when inlet PWM−outlet PWM=0 at point 304A). For the line 302B, the speed configuration that minimizes power consumption is when the inlet fan is approximately 7% faster than the outlet fan (i.e., when inlet PWM−outlet PWM=7 at point 304B). For the line 302C, the speed configuration that minimizes power consumption is when the inlet fan is approximately 7% faster than the outlet fan (i.e., when inlet PWM−outlet PWM=7 at point 304C). For the line 302D, the speed configuration that minimizes power consumption is when the inlet fan is approximately 8% faster than the outlet fan (i.e., when inlet PWM−outlet PWM=8 at point 304D). For the line 302E, the speed configuration that minimizes power consumption is when the inlet fan is approximately 12% faster than the outlet fan (i.e., when inlet PWM−outlet PWM=12 at point 304E). For the line 302F, the speed configuration that minimizes power consumption is when the inlet fan is approximately 19% faster than the outlet fan (i.e., when inlet PWM−outlet PWM=19 at point 304F). For the line 302G, the speed configuration that minimizes power consumption is when the inlet fan is approximately 18% faster than the outlet fan (i.e., when inlet PWM−outlet PWM=18 at point 304G). Although FIGS. 2 and 3 discuss push/pull configurations, it should be understood that the discussion of FIGS. 2 and 3 are also relevant to fans controlled in a push/push configuration or a pull/pull configuration.

Thus, in some embodiments, the controller 106 selectively controls both the airflow direction and the airflow intensity of multiple fans. For example, the controller 106 may be pre-programmed to provide a number of selectable airflow direction and airflow intensity settings. In such case, the operation of the controller 106 can be set based on user input and/or vendor input (e.g., via a suitable user interface and input devices). In alternative embodiments, the airflow direction and intensity settings are automatically and dynamically adjusted by the controller 106 so as to minimize power consumption while cooling a given electronic component.

For example, the controller 106 may control the airflow direction and intensity settings based on predetermined information (previous measurements) and/or based on real-time monitoring of relevant parameters (e.g., electronic component temperature, power consumption of the fans 112A and 112B or other parameters).

Figure 4:
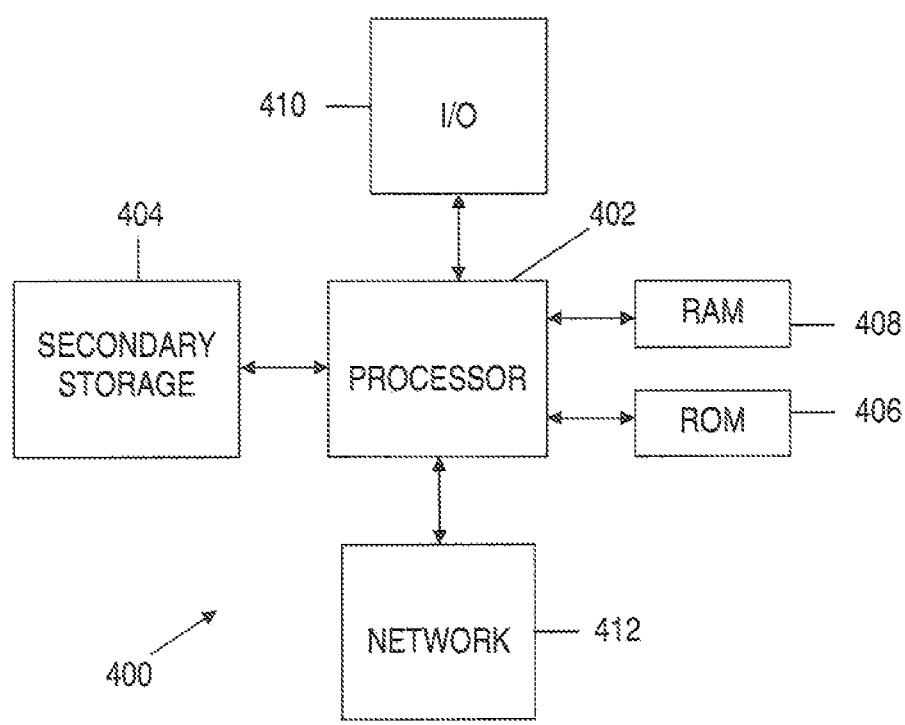
FIG. 4 shows a computing device in accordance with embodiments of the disclosure.

In at least some embodiments, the systems 100A-100E or variations thereof may facilitate cooling components of any electronic device, such as a computer, server, router, switch, or bridge. FIG. 4 illustrates a typical, general-purpose computing device 400 and components which may benefit from the systems 100A-100E. The computing device 400 includes a processor 402 (which may be referred to as a central processor unit or CPU) that is in communication with memory devices including secondary storage 404, read only memory (ROM) 406, random access memory (RAM) 408, input/output (I/O) devices 410, and network connectivity devices 412. The processor may be implemented as one or more CPU chips.

The secondary storage 404 preferably is comprised of one or more disk drives or tape drives and is used for non-volatile storage of data and as an over-flow data storage device if RAM 408 is not large enough to hold all working data. Secondary storage 404 may be used to store programs that are loaded into RAM 408 when such programs are selected for execution. The ROM 406 preferably is used to store instructions and perhaps data that are read during program execution. ROM 406 preferably is a non-volatile memory device that typically has a small memory capacity relative to the larger memory capacity of secondary storage 404. RAM 408 preferably is used to store volatile data and perhaps to store instructions. Access to both ROM 406 and RAM 408 is typically faster than to secondary storage 404. The secondary storage 404, the ROM 406, and the RAM 408 are examples of computer-readable mediums, which may store settings, instructions and/or a user interface corresponding to the controller 106. The operation of the controller 106 may or may not involve the processor 402. Based on such settings, instructions and/or user interface, the controller 106 is able to control fan direction and fan intensity as previously described.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
a heatsink;
a plurality of fans mounted to the heatsink, wherein the plurality of fans comprise
a first fan that provides an airflow for the heatsink, wherein the first fan is mounted to a first side of the heatsink,
a second fan that selectively modifies the airflow, wherein the second fan is mounted to a second side of the heatsink;
wherein the first and second fans are positionally offset from each other to provide first and second offsets orthogonal to a direction of the airflow, wherein the second offset is to provide an unblocked portion of the second side of the heatsink associated with a first airflow passage to channel airflow to and from the unblocked portion of the second side of the heatsink formed by the second offset, and the first offset is to provide an unblocked portion of the first side of the heatsink associated with a second airflow passage to channel airflow to and from the unblocked portion of the first side of the heatsink formed by the first offset, wherein portions of the first and second sides of the heatsink are included in a primary airflow passage to channel airflow between the first and second fans through portions of the first and second sides of the heatsink, wherein the first and second offsets correspond to unblocked portions of the first and second sides of the heatsink such that at least one of the first and second offsets is unblockable by a fan that is not turned on; and a controller that selectively operates the first and second fan.

2. The apparatus of claim 1 further comprising the controller coupled to the first and second fans, the controller selectively operates the first and second fans in a mutually exclusive manner.

3. The apparatus of claim 1 further comprising the controller coupled to the first and second fans, the controller selectively operates the first and second fans simultaneously by default.

4. The apparatus of claim 1 further comprising the controller coupled to the first and second fans, the controller dynamically adjusts an airflow direction configuration of the first and second fans.

5. The apparatus of claim 1 further comprising the controller coupled to the first and second fans, the controller dynamically adjusts an airflow in configuration of the first and second fans.

6. The apparatus of claim 1 further comprising the controller that controls the first and second fans based on a monitored temperature associated with the electronic component and a monitored power consumption for each of the first and second fans.

7. The apparatus of claim 1 wherein the first and second fans are on opposite sides of the heatsink.

8. The apparatus of claim 1 wherein the first and second fans are on non-adjacent sides of the heatsink.

9. The apparatus of claim 1 wherein the first and second fans are on adjacent sides of the heatsink.

10. The apparatus of claim 1 wherein the controller controls the first and second fans such that a first fan speed exceeds a second fan speed by a range of approximately 5% to 19%.

11. The apparatus of claim 1 wherein the controller varies a speed configuration of the first and second fans to determine which speed configuration minimizes power consumption while maintaining a desired temperature of an electronic component.

12. The apparatus of claim 1 wherein the controller controls the first and second fans based on a monitored temperature associated with an electronic component and a monitored power consumption for each of the first and second fans.

* * * * *

UNITED STATES PATENT AND TRADEMARK OFFICE
CERTIFICATE OF CORRECTION

PATENT NO. : 8,565,933 B2
APPLICATION NO. : 13/056105
DATED : October 22, 2013
INVENTOR(S) : Erik R. Nielsen et al.

Page 1 of 1

It is certified that error appears in the above-identified patent and that said Letters Patent is hereby corrected as shown below:

In the Claims:

In column 6, line 55, in Claim 5, delete "in" and insert -- intensity --, therefor.

In column 6, line 59, in Claim 6, delete "the" and insert -- an --, therefor.

Signed and Sealed this
Thirteenth Day of May, 2014

Michelle K. Lee
*Deputy Director of the United States Patent and Trademark Office*